(12) United States Patent
Park et al.

(10) Patent No.: US 7,345,527 B2
(45) Date of Patent: Mar. 18, 2008

(54) ULTRA WIDEBAND FILTER BASED ON A PAIR OF CROSS-COUPLED TRANSISTORS

(75) Inventors: Eun-chul Park, Yongin-si (KR); Han-seung Lee, Ansan-si (KR); Gyu-hyung Cho, Daejon (KR); Hee-seok Han, Daejon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 11/343,976

(22) Filed: Feb. 1, 2006

(65) Prior Publication Data
US 2006/0176104 A1 Aug. 10, 2006

(30) Foreign Application Priority Data
Feb. 4, 2005 (KR) .................... 10-2005-0010865

(51) Int. Cl.
*H03K 5/00* (2006.01)
(52) U.S. Cl. .................................................. 327/552
(58) Field of Classification Search ........ 327/551–559; 330/303, 305
See application file for complete search history.

(56) References Cited
U.S. PATENT DOCUMENTS

| | | | | |
|---|---|---|---|---|
| 5,475,338 A | * | 12/1995 | Yamaguchi | 327/552 |
| 5,600,288 A | * | 2/1997 | Liu | 333/214 |
| 5,912,587 A | * | 6/1999 | Mihailovits et al. | 330/252 |
| 5,966,046 A | * | 10/1999 | Bezzam et al. | 327/552 |
| 6,538,499 B1 | * | 3/2003 | Lu | 327/557 |
| 6,990,327 B2 | * | 1/2006 | Zheng et al. | 455/307 |

\* cited by examiner

*Primary Examiner*—Dinh T. Le
(74) *Attorney, Agent, or Firm*—Sughrue Mion, PLLC

(57) ABSTRACT

An ultra wideband filter is provided that filters an input signal using a pair of cross-coupled transistors with a small size and small power consumption. The ultra wideband filter includes a reference current generator unit generating a reference current using a bias signal of a predetermined level, a transconductor unit that is biased by the reference current and converts a predetermined input voltage into a current of a predetermined amount to output the current if the input voltage is applied thereto, and a filter unit that outputs a predetermined output voltage corresponding to the output current of the transconductor unit using a plurality of cross-coupled transistors and capacitors. The filter unit may include cross-coupled nMOS and pMOS transistors, and first and second capacitors respectively connected to respective drain terminals of the nMOS and pMOS transistors. Accordingly, the ultra wideband filter can be designed in a minimum size.

14 Claims, 6 Drawing Sheets

ULTRA WIDEBAND FILTER BASED ON A PAIR OF CROSS-COUPLED TRANSISTORS

This application claims priority from Korean Patent Application No. 10-2005-0010865, filed on Feb. 4, 2005 in the Korean Intellectual Property Office, the entire disclosure of which is incorporated herein by reference.

BACKGROUND OF THE INVENTION

1. Field of the Invention

Apparatuses consistent with the present invention relate to an ultra wideband filter for filtering an input voltage, and more particularly, to an ultra wideband filter for filtering an input voltage using a pair of cross-coupled nMOS and pMOS transistors.

2. Description of the Related Art

Generally, a communication system uses a frequency of a certain band to transmit data. A communication system that uses a relatively wide frequency band is referred to as an ultra wideband (UWB) communication system. The ultra wideband communication system transmits and receives data using a band of several hundreds of MHz or greater so as to transmit and receive a large amount of data per unit time. In this respect, the ultra wideband communication system requires an ultra wideband filter that filters an ultra wideband signal.

Meanwhile, an active R-C filter, a Gm-C filter, and other filters have been used to filter an analog signal.

FIG. 1 is a circuit diagram illustrating a conventional active R-C filter. Referring to FIG. 1, the conventional active R-C filter includes a resistor R1, a capacitor, and a Miller integrator consisting of an operational amplifier. A transfer function of a frequency in the circuit of FIG. 1 is obtained by Equation (1).

$$T(s) = \frac{V_o(s)}{V_i(s)} = -\frac{1}{\frac{R_1}{R_2} + sC_2 R_1} = -\frac{\frac{1}{C_2 R_1}}{s + \frac{1}{C_2 R_2}} \quad \text{Equation (1)}$$

However, since the active R-C filter uses an operational amplifier having high voltage gain, the available frequency band of the active R-C filter is limited to 100 MHz or less. Therefore, the active R-C filter is not suitable for an ultra wideband communication system. Also, a problem arises in that the size of the filter increases due to a large size of the operational amplifier.

Meanwhile, FIG. 2 is a circuit diagram illustrating a conventional. Gm-C filter. Referring to FIG. 2, the conventional Gm-C filter includes a plurality of transconductors T1 and T2, and a plurality of capacitors CX and CA. If an input signal is applied to a non-inverting terminal of the first transconductor T1, a predetermined output signal having a varied amplitude and phase of the input signal is output through the second transconductor T2. In the circuit of FIG. 2, the input signal-to-the output signal ratio and a transfer function can be obtained by Equation (2).

$$H(S) = \frac{V_o(S)}{V_i(S)} = \frac{\left(\frac{C_X}{C_A + C_X}\right)S + \left(\frac{Gm1}{C_A + C_X}\right)}{S + \left(\frac{Gm2}{C_A + C_X}\right)} \quad \text{Equation (2)}$$

In Equation (2), Gm1 and Gm2 represent transconductances of the first and second transconductors, respectively, and $C_X$ and $C_A$ represent capacitance of each capacitor.

The Gm-C filter has a problem that it is not suitable for the ultra wideband communication system because of its limited frequency band. Also, to design the Gm-C filter, elements such as a plurality of transistors and capacitors are required. A tuning circuit is additionally required to obtain desired characteristics because the Gm-C filter is susceptible to process variation, temperature variation, and so on. For this reason, problems arise in that power consumption increases and the size of the filter increases. Moreover, it is difficult to exactly obtain a filter specification of a desired design due to capacitance of respective elements of the Gm-C filter.

SUMMARY OF THE INVENTION

The present invention has been developed in order to solve the above drawbacks and other problems associated with the conventional arrangement. An aspect of the present invention provides an ultra wideband filter that filters an input signal using a pair of cross-coupled- transistors with a small size and small power consumption and can be used in an ultra wideband communication system.

In order to achieve the above and other aspects of the present invention, there is provided an ultra wideband filter comprising a reference current generator unit that generates a reference current using a bias signal of a predetermined level, a transconductor unit that is biased by the reference current from the reference current generator, the transconductor unit converting a predetermined input voltage into a predetermined output current that is output if the input voltage is applied to the transconductor unit, and a filter unit that outputs a predetermined output voltage corresponding to the output current of the transconductor unit using a plurality of cross-coupled transistors and capacitors.

The filter unit includes nMOS and pMOS transistors that are cross-coupled, and first and second capacitors that are respectively connected to respective drain terminals of the nMOS and pMOS transistors.

The filter unit includes a first MOS transistor having a drain terminal to which an output current of the transconductor is applied, a first capacitor that connects a ground terminal to the drain terminal of the first MOS transistor, a second MOS transistor having a drain terminal connected to the drain terminal of the first MOS transistor and a source terminal connected to a gate terminal of the first MOS transistor, and a second capacitor that connects the ground terminal to the source terminal of the second MOS transistor, wherein a voltage applied to the second capacitor is output as the output voltage. Thus, a transfer function relation expressed by a predetermined equation is formed between the input voltage and the output voltage.

The filter unit further includes a third MOS transistor having a drain terminal connected to the gate terminal of the first MOS transistor and a gate terminal to which a bias signal of a predetermined level is applied, and a predetermined resistor that connects the second capacitor to the source terminal of the second MOS transistor.

In another aspect, an ultra wideband filter is provided comprising a reference current generator unit that generates a reference current using a bias signal of a predetermined level, a transconductor unit that is biased by the reference current from the reference current generator, the transconducutor unit outputting first and second currents respectively corresponding to first and second differential input voltages if the first and second differential input voltages are applied to the transconductor unit, and a filter unit that outputs first and second differential output voltages respectively corresponding to the first and second currents using a plurality of cross-coupled transistors and capacitors.

The filter unit includes a first filter terminal that outputs the first differential output voltage corresponding to the first current if the first current is applied to the first filter terminal, and a second filter terminal that outputs the second differential output voltage corresponding to the second current if the second current is applied to the second filter terminal.

Each of the first and second filter terminals may include cross-coupled nMOS and pMOS transistors, and two capacitors that are respectively connected to respective drain terminals of the nMOS and pMOS transistors.

Each of the first and second filter terminals has characteristics of a transfer function that may be expressed by a predetermined equation.

The first filter terminal may include a first MOS transistor having a drain terminal to which the first current is applied, a first capacitor that connects a ground terminal to the drain terminal of the first MOS transistor, a second MOS transistor having a gate terminal connected to the drain terminal of the first MOS transistor and a source terminal connected to a gate terminal of the first MOS transistor, and a second capacitor that connects the ground terminal to the source terminal of the second MOS transistor, wherein a voltage that is applied to the second capacitor is output as the first differential output voltage.

The second filter terminal may include a third MOS transistor having a drain terminal to which an output current of the transconductor unit is applied, a third capacitor that connects the ground terminal to the drain terminal of the third MOS transistor, a fourth MOS transistor having a gate terminal connected to the drain terminal of the third MOS transistor and a source terminal connected to the gate terminal of the third MOS transistor, and a fourth capacitor that connects the ground terminal to the source terminal of the fourth MOS transistor, wherein a voltage that is applied to the fourth capacitor is output as the second differential output voltage.

Further, the first filter terminal may include a fifth MOS transistor having a drain terminal connected to the gate terminal of the first MOS transistor, and a first resistor that connects the second capacitor to the source terminal of the second MOS transistor.

The second filter terminal may include a sixth MOS transistor having a drain terminal connected to the gate terminal of the third MOS transistor, and a second resistor that connects the fourth capacitor to the source terminal of the fourth MOS transistor.

The gate terminal of the fifth MOS transistor may be connected to the drain terminal of the sixth MOS transistor, and the gate terminal of the sixth MOS transistor is connected to the drain terminal of the fifth MOS transistor.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

Figure 1:
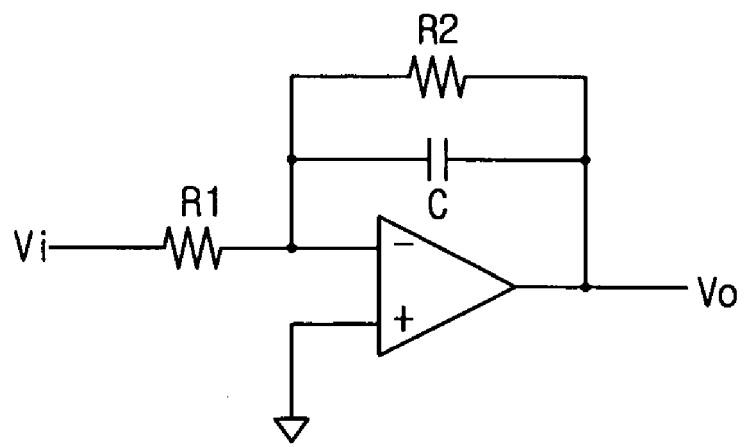
FIG. 1 is a circuit diagram illustrating a conventional active R-C filter.
Figure 2:
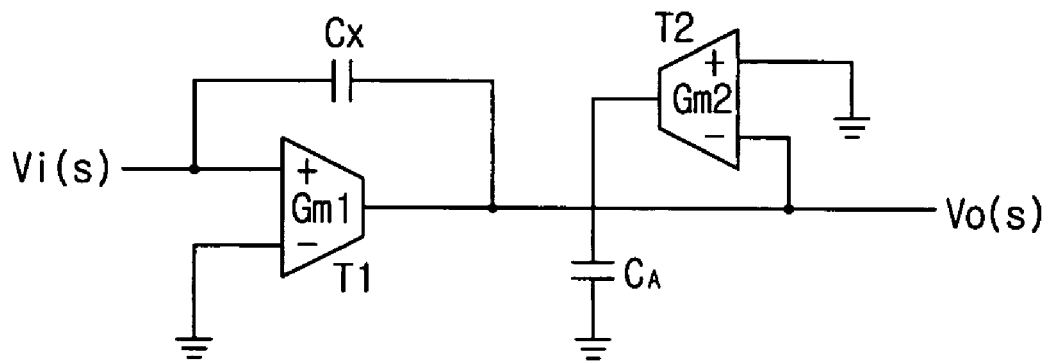
FIG. 2 is a circuit diagram illustrating a conventional Gm-C filter.

Hereafter, exemplary embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 3:
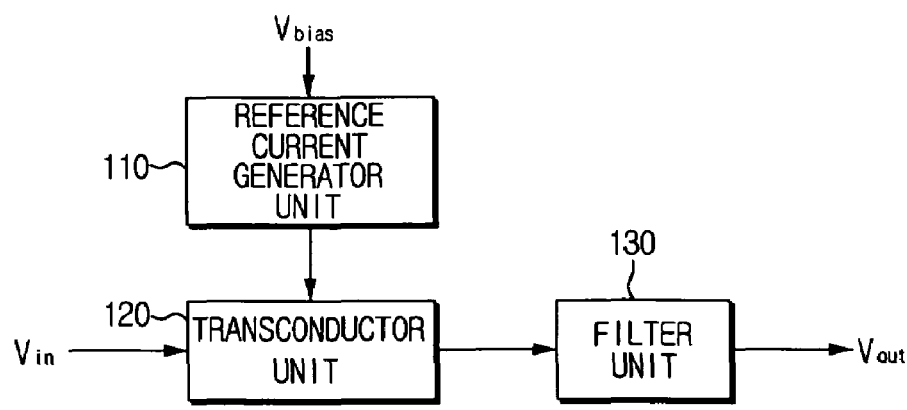
FIG. 3 is a block diagram illustrating an ultra wideband filter according to an exemplary embodiment of the present invention.

FIG. 3 is a block diagram illustrating an ultra wideband filter according to an exemplary embodiment of the present invention. Referring to FIG. 3, the ultra wideband filter according to an exemplary embodiment of the present invention includes a reference current generator unit 110, a transconductor unit 120, and a filter unit 130.

The reference current generator unit 110 serves to output a predetermined reference current if a predetermined bias power source is connected thereto.

The transconductor unit 120 is biased by the reference current output from the reference current generator unit 110 and serves to output a current corresponding to a predetermined input voltage applied thereto.

The filter unit 130 serves to output a predetermined output voltage corresponding to the output current of the transconductor unit 120 using cross-coupled n MOS and pMOS transistors.

Figure 4:
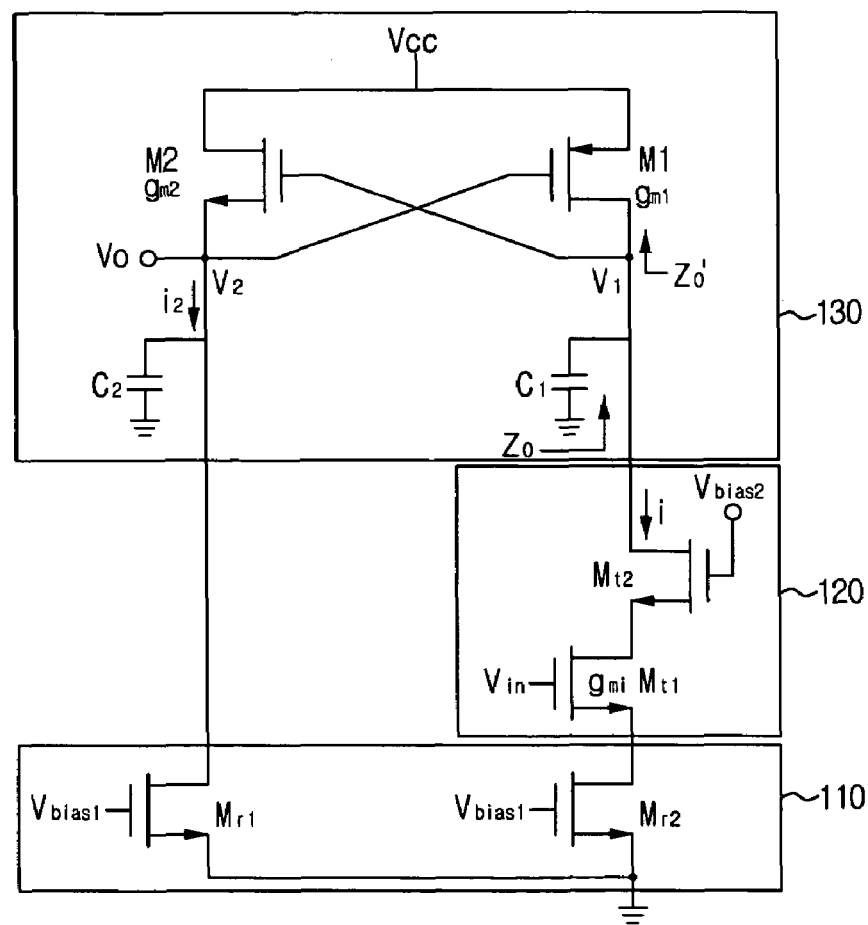
FIGS. 4 to 8 are circuit diagrams illustrating an ultra wideband filter according to an exemplary embodiment of the present invention.

FIGS. 4 to 8 are circuit diagrams illustrating the ultra wideband filter according to an exemplary embodiment of the present invention. FIG. 4 illustrates a circuit of the ultra wideband filter to which a single input voltage is applied. Referring to FIG. 4, the reference current generator unit 110 is comprised of a plurality of MOS transistors Mr1 and Mr2. If a predetermined bias voltage $V_{bias1}$ is applied to each gate terminal of the MOS transistors Mr1 and Mr2, a predetermined reference current Iref flows in each drain terminal of the MOS transistors Mr1 and Mr2 to bias the transconductor unit 120.

The transconductor unit 120 can be comprised of a plurality of MOS transistors Mt1 and Mt2. An input voltage Vin is applied to a gate terminal of the MOS transistor Mt1. Supposing that the transconductance of the MOS transistor Mt1 is $g_{mi}$, a current obtained by multiplying the input voltage Vin by $g_{mi}$ is output to a drain terminal of the MOS transistor Mt1. The output current of the MOS transistor Mt1 is output to the rear end through the MOS transistor Mt2. The MOS transistor Mt2 provides a load of a predetermined size so that the MOS transistor Mt1 operates in a linear region.

The filter unit 130 can be comprised of a first transistor M1, a second transistor M2, a first capacitor C1, and a second capacitor C2. A gate terminal of the first transistor M1 is connected to a source terminal of the second transistor M2, and a gate terminal of the second transistor M2 is connected to a drain terminal of the first transistor M1. In other words, the first and second transistors M1 and M2 are cross-coupled to each other. Meanwhile, the first capacitor C1 connects the drain terminal of the first transistor M1 to a ground terminal while the second capacitor C2 connects the source terminal of the second transistor M2 to the ground terminal.

Hereinafter, a transfer function of the ultra wideband filter according to an exemplary embodiment of the present invention will be described with reference to the circuit of FIG. 4. As shown in FIG. 4, supposing a drain voltage and a drain current of the first transistor M1 are V1 and i1, respectively, and a source voltage and a drain current of the second transistor M2 are V2 and i2, respectively, then i2 becomes $g_{m2}*(V2-V1)$. In this case, since V2 is $i2/(sC_2)$, then $V2=(g_{m2}*V1)/(sC_2+g_{m2})$ (hereinafter, referred to as a first expression) is obtained by i2. In FIG. 4, V2 becomes an output voltage Vo of the ultra wideband filter according to an exemplary embodiment of the present invention.

Meanwhile, since i1 is the drain current of the first transistor M1, the expression $i1=g_{m1}*V2$ is obtained. This expression is obtained as $i1=(g_{m1}*g_{m2}*V1)/(sC_2+g_{m2})$ by substitution of V2. If impedance viewed from the drain terminal of the first transistor M1 is $Z_o'$, then $Z_o'=(sC_2+g_{m2})/(g_{m1}*g_{m2})$ is obtained. In this case, impedance $Z_o$ viewed from the output terminal of the transconductor unit 120 becomes $(1/sC_1)/(Z_o')$. By arranging this relationship, $Z_o=(sC_2+g_{m2})/\{s^2C_2C_1+sC_1g_{m2}+g_{m1}g_{m2}\}$ (hereinafter, referred to as a second expression) is obtained.

Further, the relation expression $V1=i1*Z_o=g_{m1}*Vin*Z_o$ may be obtained. By substituting the first and second expressions for this relation expression, the following transfer function (Equation (3)) can be obtained.

$$H(s) = \frac{\omega_o^2}{s^2 + \omega_o s/Q + \omega_o^2} \quad \text{Equation (3)}$$

$$\omega_o = \sqrt{\frac{g_{m1}g_{m2}}{C_1C_2}}$$

$$Q = \sqrt{\frac{g_{m1}C_2}{g_{m2}C_1}}$$

In Equation (3), H(S) represents the transfer function, $\omega_0$ represents the cutoff frequency, Q represents the selectivity (quality factor), and gm1 represents the transconductance of the first MOS transistor. According to Equation (3), the cutoff frequency of the ultra wideband filter according to an exemplary embodiment of the present invention is proportional to the transconductance of each of the first and second MOS transistors and inversely proportional to capacitance of each of the first and second capacitors. Therefore, a bandwidth of the filter can be adjusted by adjusting the sizes of the transconductance and the capacitance.

Figure 5:
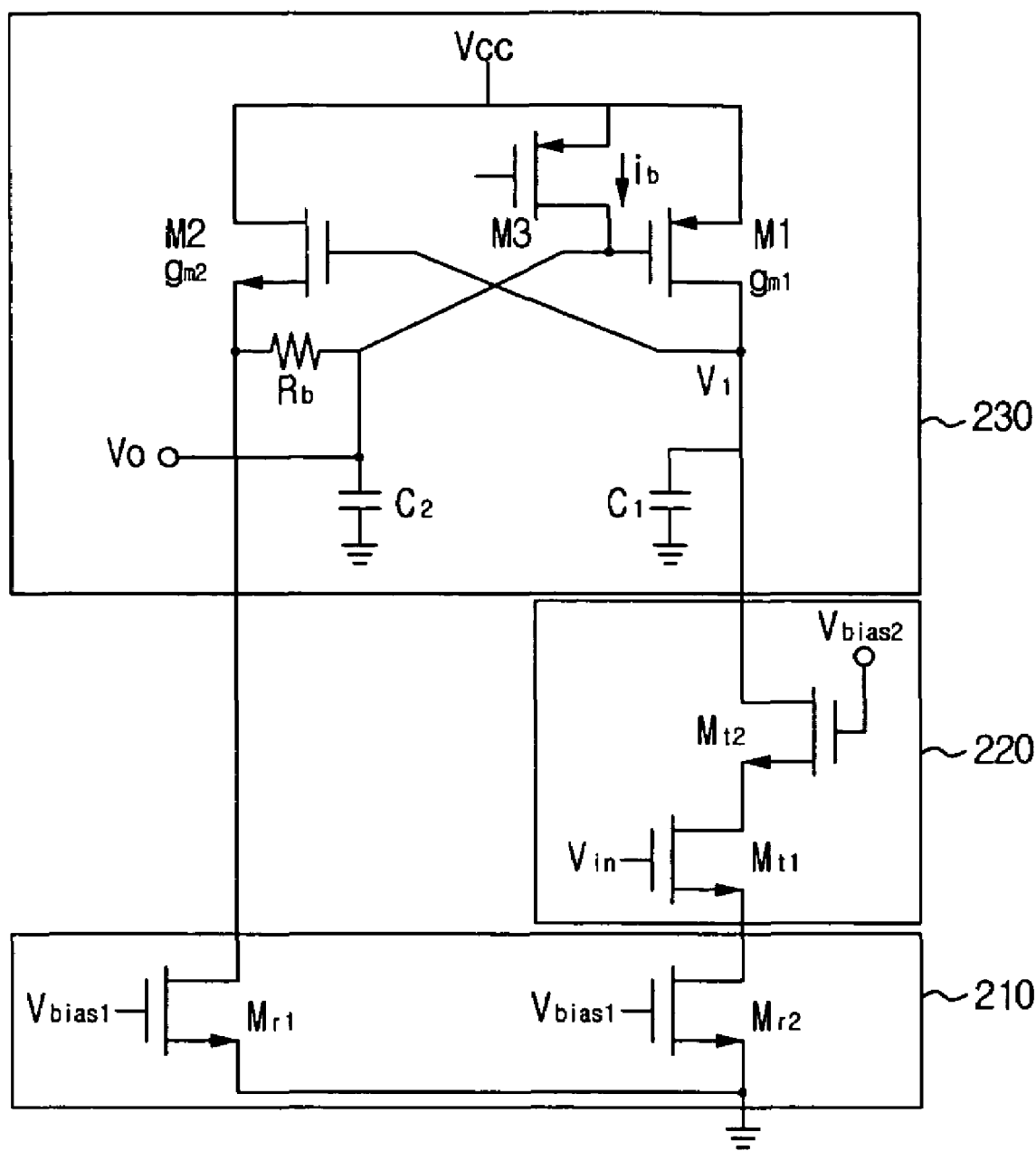

FIG. 5 is a circuit diagram illustrating the filter unit 230 additionally provided with a transistor M3 and a resistor Rb.

Since the structures of a reference current generator unit 210 and a transconductor unit 220 are the same as in FIG. 4, detailed description thereof will be omitted.

The transistor M3 serves as a current source. A bias power source of a predetermined level is connected with a gate terminal of the transistor M3. A current Ib is output to a drain terminal of the transistor M3. Since a drain current of the transistor M3 does not flow to a gate of a pMOS transistor, the drain current does not affect the transconductance value $g_{m1}$ of the transistor M1.

By adding the transistor M3 and the resistor Rb to the filter unit 230, the filter unit 230 is operated in a saturation region. In other words, the cross-coupled nMOS transistors are always operated in a saturation region but the pMOS transistors are operated in a triode region due to the voltage difference between gate and source of the NMOS transistor. Thus, the voltage difference of the nMOS transistor is compensated by a voltage generated by the flow of current Ib in the resistor Rb, such that the pMOS transistors are operated in the saturation region. Meanwhile, the cutoff frequency is varied by the resistor Rb as Equation (4).

$$\omega = \sqrt{\frac{g_{m1}*\left(g_{m2} // \frac{1}{R_b}\right)}{C_1C_2}} \quad \text{Equation (4)}$$

$$Q = \sqrt{\frac{g_{m1}*C_2}{(g_{m2}+1/R_b)C_1}}$$

Figure 6:
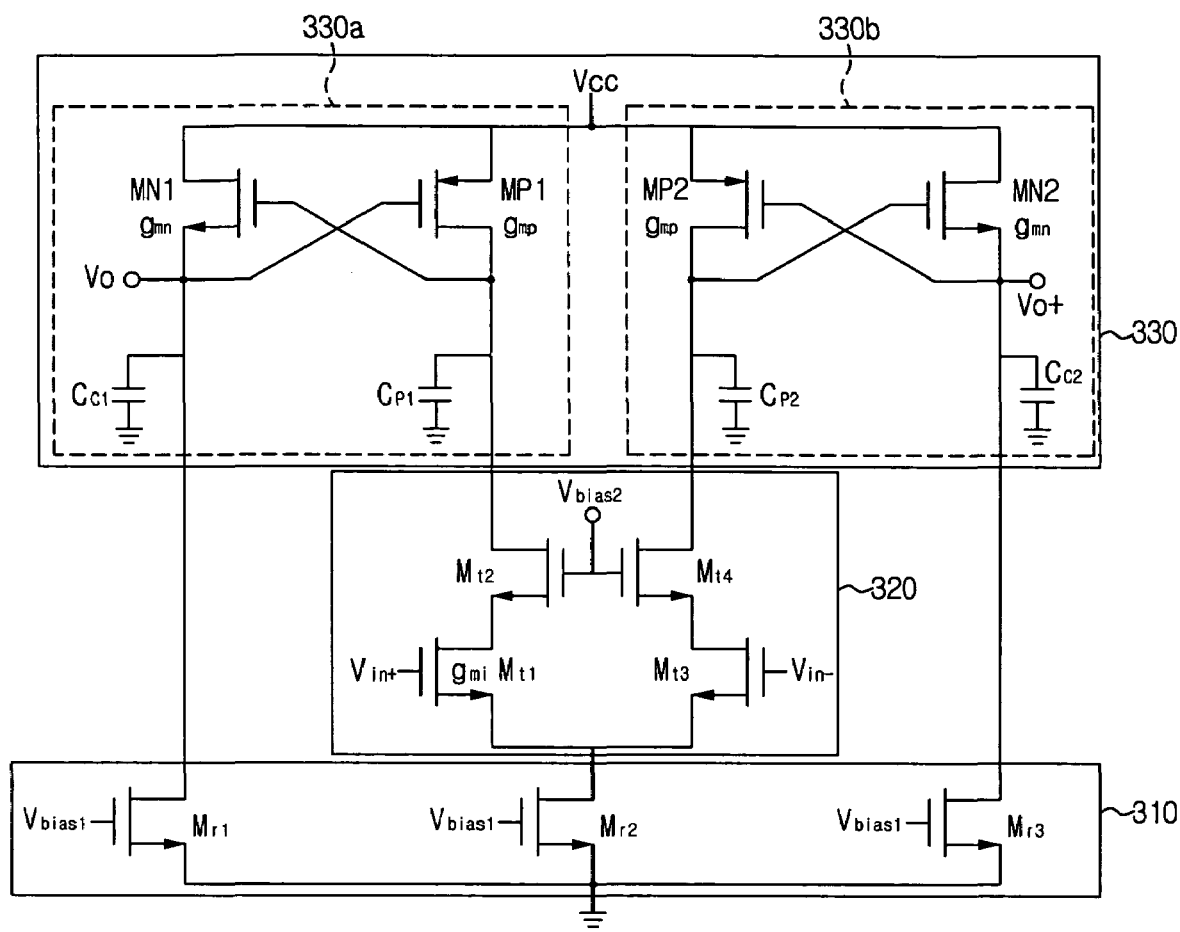
Figure 7:
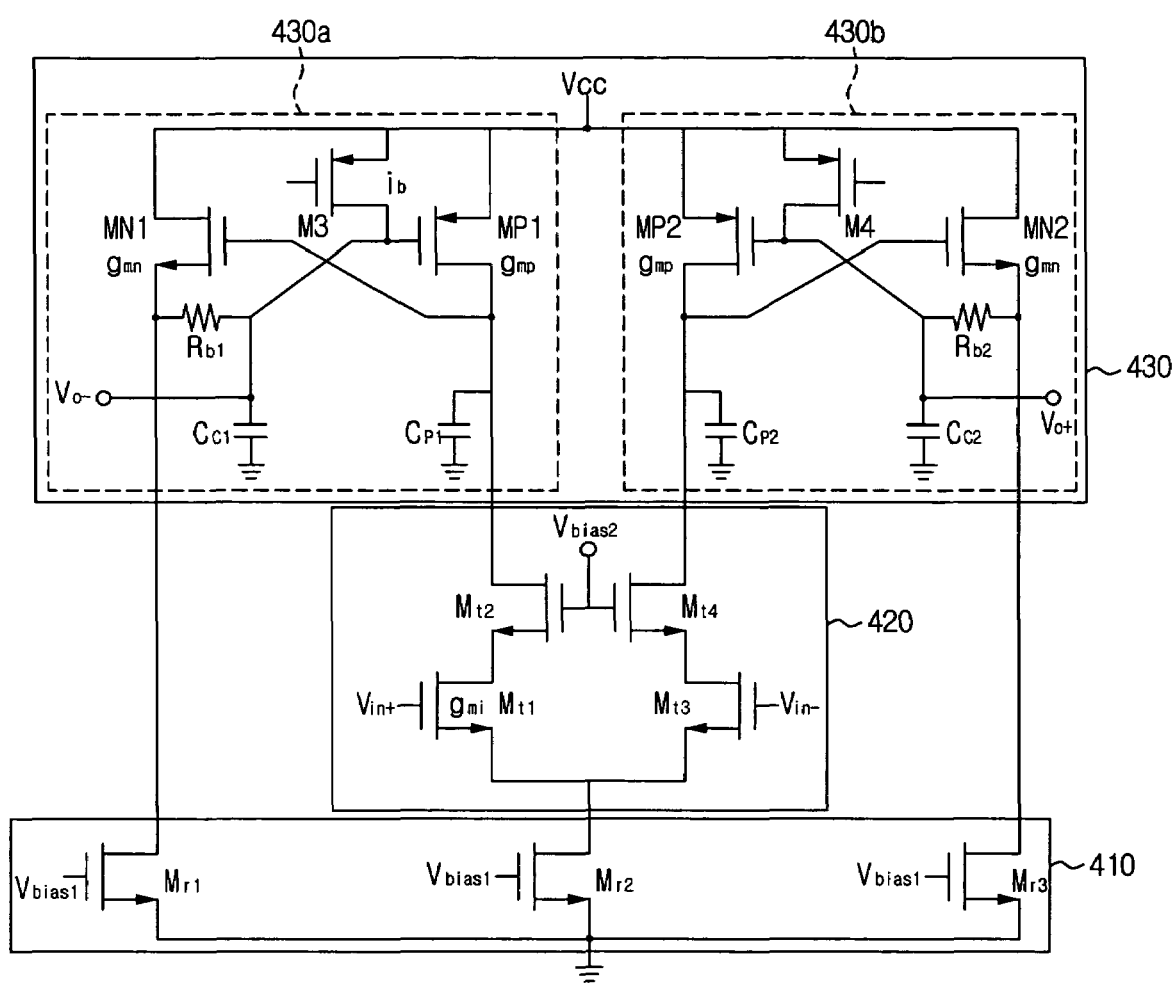
Figure 8:
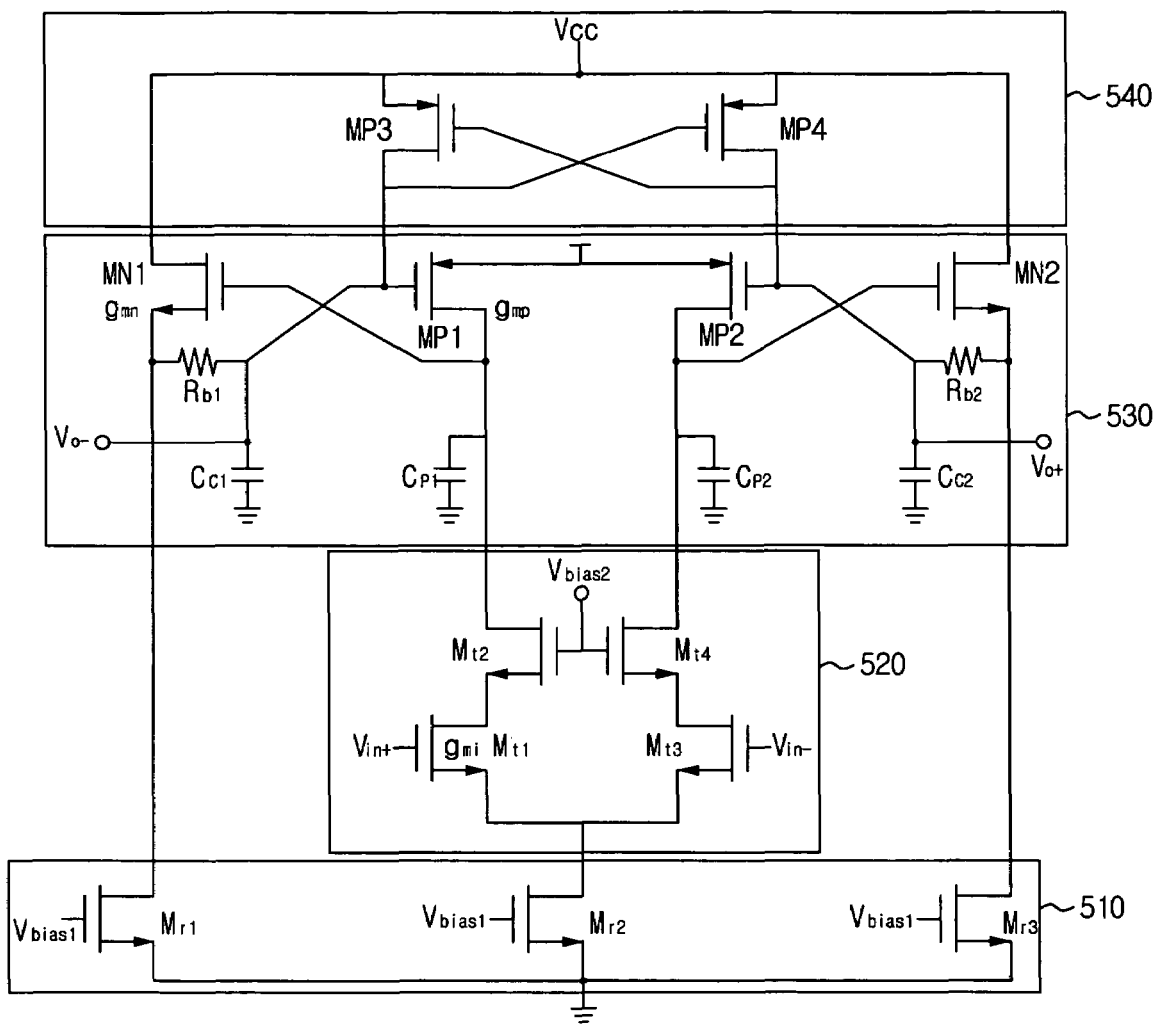

The ultra wideband filter of FIG. 4 and FIG. 5 are designed to filter a single input voltage. The ultra wideband filter according to an exemplary embodiment of the present invention may be used in case where a differential input voltage is input thereto. FIG. 6 to FIG. 8 are circuit diagrams illustrating the ultra wideband filter for filtering a differential input voltage.

Referring to FIG. 6, the ultra wideband filter according to an exemplary embodiment of the present invention includes a reference current generator unit 310, a transconductor unit 320, and a filter unit 330. In this case, the filter unit 330 includes a first filter terminal 330a and a second filter terminal 330b.

The reference current generator unit 310 serves to respectively supply a reference current to the first and second filter terminals 330a and 330b and the transconductor 320. To this end, the reference current generator unit 310 may be comprised of three MOS transistors Mr1, Mr2 and Mr3. Since the detailed operation of the reference current generator unit 310 is the same as that of FIG. 4, its description will be omitted.

The differential input voltage is input to the transconductor unit 320. The transconductor unit 320 is comprised of MOS transistors Mt2 and Mt4 that provide a load of a predetermined size, so that a MOS transistor Mt1 having a gate terminal to which a first differential input voltage $V_{in+}$ is applied and a MOS transistor Mt3 having a gate terminal to which a second differential input voltage $V_{in-}$ is applied are respectively operated in a linear region.

A current corresponding to the first differential input voltage $V_{in+}$ flows into the first filter terminal 330a so that a first differential output voltage $V_{o-}$ is output. Also, a current corresponding to the second differential input voltage $V_{in-}$ flows into the second filter terminal 330b so that a second differential output voltage $V_{o+}$ is output.

Since the first filter terminal 330a and the second filter terminal 330b are constructed in the same manner as the filter unit 130 of FIG. 4, their operations and transfer functions will be omitted. Meanwhile, elements MP1, MN1, $C_{P1}$, and $C_{C1}$ of the first filter terminal 330a have the same characteristics as those of elements MP2, MN2, $C_{P2}$, and $C_{C2}$ of the second filter terminal 330b.

FIG. 7 is a circuit diagram illustrating the ultra wideband filter according to another exemplary embodiment of the present invention. A reference current generator unit 410 and a transconductor unit 420 of FIG. 7 are the same as those of FIG. 6. Thus, their description will be omitted.

A filter unit 430 of FIG. 7 includes a first filter terminal 430a and a second filter terminal 430b. Resistors $R_{b1}$ and $R_{b2}$ and MOS transistors M3 and M4 are respectively inserted into the first filter terminal 430a and the second filter terminal 430b. Since the filter unit 430 is operated in the same manner as that of FIG. 5, its detailed description will be omitted.

FIG. 8 is a circuit diagram illustrating the ultra wideband filter according to another exemplary embodiment of the present invention. Referring to FIG. 8, the ultra wideband filter according to another exemplary embodiment of the present invention further includes a feedback unit 540 in addition to a reference current generator unit 510, a transconductor unit 520 and a filter unit 530.

The reference current generator unit 510 and the transconductor unit 520 are the same as those of the aforementioned exemplary embodiments. Thus, their description will be omitted.

The feedback unit 540 is comprised of a pair of pMOS transistors MP3 and MP4. A gate terminal of the transistor MP3 is connected with a drain terminal of the transistor MP4, and a gate terminal of the transistor MP4 is connected with a drain terminal of the transistor MP3. Thus, the feedback unit 540 provides high loop gain to the filter unit 530. As a result, since the values $g_{mp1}$ and $g_{mp2}$ increase, the Q value in the transfer function increases. Also, since the resistors $R_{b1}$ and $R_{b2}$ are inserted into the filter unit 530, a cutoff frequency value increases. Thus, the filter characteristics are improved.

As described above, the ultra wideband filter according to an exemplary embodiment of the present invention can be obtained by only using two cross-coupled MOS transistors without using an operational amplifier. Thus, an ultra wideband filter with a small size can be obtained. Further, it is possible to reduce power consumption and the size of the layout area. Also, the ultra wideband filter can filter an ultra wideband signal by adjusting characteristics of the respective MOS transistors.

The foregoing embodiments are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An ultra wideband filter comprising:
    a reference current generator unit that generates a reference current using a bias signal of a predetermined level;
    a transconductor unit that is coupled to the reference current generator unit directly, and is biased by the reference current from the reference current generator, the transconductor unit converting a predetermined input voltage into a predetermined output current that is output if the input voltage is applied to the transconductor unit; and
    a filter unit that outputs a predetermined output voltage corresponding to the output current of the transconductor unit using a plurality of cross-coupled transistors and capacitors,
    wherein at least one of the capacitors is coupled to a ground terminal.

2. The ultra wideband filter as claimed in claim 1, wherein the filter unit includes nMOS and pMOS transistors that are cross-coupled, and first and second capacitors that are respectively connected to respective drain terminals of the nMOS and pMOS transistors.

3. The ultra wideband filter as claimed in claim 1, wherein the filter unit includes:
    a first MOS transistor having a drain terminal to which an output current of the transconductor is applied;
    a first capacitor that connects a ground terminal to the drain terminal of the first MOS transistor;
    a second MOS transistor having a gate terminal connected to the drain terminal of the first MOS transistor and a source terminal connected to a gate terminal of the first MOS transistor; and
    a second capacitor that connects the ground terminal to the source terminal of the second MOS transistor, wherein a voltage applied to the second capacitor is output as the output voltage.

4. The ultra wideband filter as claimed in claim 2, wherein a transfer function between the input voltage and the output voltage is expressed as follows:
    where H(S) represents the transfer function, $\omega 0$ is a cutoff frequency, Q is a selectivity (quality factor), gm1 is a transconductance of the first MOS transistor, gm2 is a transconductance of the second MOS transistor, C1 is a capacitance of the first capacitor, and C2 is a capacitance of the second capacitor.

5. The ultra wideband filter as claimed in claim 4, wherein the filter unit further includes:
    a third MOS transistor having a drain terminal connected to the gate terminal of the first MOS transistor and a gate terminal to which a bias signal of a predetermined level is applied; and
    a predetermined resistor that connects the second capacitor to the source terminal of the second MOS transistor.

6. An ultra wideband filter comprising:
    a reference current generator unit that generates a reference current using a bias signal of a predetermined level;
    a transconductor unit that is coupled to the reference current generator unit directly, and is biased by the reference current from the reference current generator, the transconductor unit outputting first and second currents respectively corresponding to first and second differential input voltages if the first and second differential input voltages are applied to the transconductor unit; and
    a filter unit that outputs first and second differential output voltages respectively corresponding to the first and second currents using a plurality of cross-coupled transistors and capacitors,
    wherein at least one of the capacitors is coupled to a ground terminal.

7. The ultra wideband filter as claimed in claim 6, wherein the filter unit includes:

a first filter terminal that outputs the first differential output voltage corresponding to the first current if the first current is applied to the first filter terminal; and a second filter terminal that outputs the second differential output voltage corresponding to the second current if the second current is applied to the second filter terminal.

8. The ultra wideband filter as claimed in claim 7, wherein each of the first and second filter terminals includes cross-coupled nMOS and pMOS transistors, and two capacitors that are respectively connected to respective drain terminals of the NMOS and pMOS transistors.

9. The ultra wideband filter as claimed in claim 8, wherein each of the first and second filter terminals has characteristics of a transfer function expressed as follows:

where, H(S) represents the transfer function, $\omega 0$ is a cutoff frequency, Q is a selectivity (quality factor), gmp is a transconductance of the pMOS transistor, gmn is a transconductance of the nMOS transistor, CP is a capacitance of the capacitor that is connected to the drain terminal of the pMOS transistor, and CC is a capacitance of the capacitor that is connected to the drain terminal of the nMOS transistor.

10. The ultra wideband filter as claimed in claim 9, wherein the first filter terminal includes:

a first MOS transistor having a drain terminal to which the first current is applied;

a first capacitor that connects a ground terminal to the drain terminal of the first MOS transistor;

a second MOS transistor having a gate terminal connected to the drain terminal of the first MOS transistor and a source terminal connected to a gate terminal of the first MOS transistor; and a second capacitor that connects the ground terminal to the source terminal of the second MOS transistor, wherein a voltage that is applied to the second capacitor is output as the first differential output voltage.

11. The ultra wideband filter as claimed in claim 9, wherein the second filter terminal includes:

a third MOS transistor having a drain terminal to which an output current of the transconductor unit is applied;

a third capacitor that connects the ground terminal to the drain terminal of the third MOS transistor;

a fourth MOS transistor having a gate terminal connected to the drain terminal of the third MOS transistor and a source terminal connected to the gate terminal of the third MOS transistor; and a fourth capacitor that connects the ground terminal to the source terminal of the fourth MOS transistor, wherein a voltage that is applied to the fourth capacitor is output as the second differential output voltage.

12. The ultra wideband filter as claimed in claim 9, wherein the first filter terminal includes:

a fifth MOS transistor having a drain terminal that is connected to the gate terminal of the first MOS transistor; and a first resistor that connects the second capacitor to the source terminal of the second MOS transistor.

13. The ultra wideband filter as claimed in claim 9, wherein the second filter terminal includes:

a sixth MOS transistor having a drain terminal that is connected to the gate terminal of the third MOS transistor; and a second resistor that connects the fourth capacitor to the source terminal of the fourth MOS transistor.

14. The ultra wideband filter as claimed in claim 13, wherein the gate terminal of the fifth MOS transistor is connected to the drain terminal of the sixth MOS transistor, and the gate terminal of the sixth MOS transistor is connected to the drain terminal of the fifth MOS transistor.

* * * * *